United States Patent
Rho et al.

(10) Patent No.: US 11,159,149 B2
(45) Date of Patent: Oct. 26, 2021

(54) ELECTRONIC DEVICE INCLUDING LEVEL SHIFTER

(71) Applicant: Samsung Electronics Co., Ltd., Suwon-si (KR)

(72) Inventors: Soojung Rho, Hwaseong-si (KR); Jang-Woo Ryu, Seoul (KR); Hyunah An, Seoul (KR); Hangi Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/021,367

(22) Filed: Sep. 15, 2020

(65) Prior Publication Data

US 2021/0226617 A1 Jul. 22, 2021

(30) Foreign Application Priority Data

Jan. 20, 2020 (KR) .................. 10-2020-0007139

(51) Int. Cl.
*H03L 5/00* (2006.01)
*H03K 3/356* (2006.01)
*G11C 7/22* (2006.01)

(52) U.S. Cl.
CPC ....... *H03K 3/356121* (2013.01); *G11C 7/222* (2013.01)

(58) Field of Classification Search
CPC .......................... H03K 3/356121; G11C 7/222
USPC ...................................... 327/333; 326/80, 81
See application file for complete search history.

(56) References Cited

U.S. PATENT DOCUMENTS

| | | | |
|---|---|---|---|
| 5,821,800 A | 10/1998 | Le et al. | |
| 6,384,808 B2 * | 5/2002 | Azami | H03K 3/356 345/100 |
| 6,542,144 B2 * | 4/2003 | Kogure | G09G 3/3677 326/60 |
| 6,731,273 B2 * | 5/2004 | Koyama | H03K 19/018578 327/333 |
| 7,005,909 B2 | 2/2006 | Shin | |
| 7,019,559 B2 * | 3/2006 | Kouzuma | H03K 3/012 326/68 |
| 7,199,617 B1 | 4/2007 | Schrom et al. | |
| 7,355,905 B2 * | 4/2008 | Campbell | G11C 7/00 365/189.11 |

(Continued)

FOREIGN PATENT DOCUMENTS

| | | |
|---|---|---|
| JP | 4053417 B2 | 2/2008 |
| JP | 4640788 B2 | 3/2011 |

*Primary Examiner* — Ryan Jager
(74) *Attorney, Agent, or Firm* — Harness, Dickey & Pierce, P.L.C.

(57) ABSTRACT

Disclosed is a level shifter. The level shifter includes a level shifting circuit, a first adjusting circuit, and a second adjusting circuit. The level shifting circuit determines whether to output a first current from a supply voltage line to an output node based on a voltage level of a first node and determines whether to output a second current from the supply voltage line to a third node based on a voltage level of a second node. The first adjusting circuit blocks an output of a third current from the third node to the first node when a clock signal having a first voltage level is received. The second adjusting circuit outputs a fourth current from the first node to a ground voltage line when the clock signal having the first voltage level is received.

17 Claims, 10 Drawing Sheets

(56) References Cited

U.S. PATENT DOCUMENTS

| | | |
|---|---|---|
| 7,737,748 B2 | 6/2010 | Kim et al. |
| 7,816,969 B2 | 10/2010 | Yoo |
| 2006/0139059 A1 | 6/2006 | Jeong |
| 2007/0164789 A1 | 7/2007 | Panjwani et al. |

* cited by examiner

ELECTRONIC DEVICE INCLUDING LEVEL SHIFTER

CROSS-REFERENCE TO RELATED APPLICATIONS

This application claims priority under 35 U.S.C. § 119 to Korean Patent Application No. 10-2020-0007139 filed on Jan. 20, 2020, in the Korean Intellectual Property Office, the disclosures of which are incorporated by reference herein in their entireties.

BACKGROUND

Some example embodiments of the inventive concepts described herein relate to electronic devices including a level shifter, and more particularly, relate to electronic devices including a level shifter that generates an output voltage different from an input voltage based on the input voltage.

Electronic devices may include various elements. Various elements may operate in the same voltage domain or may operate in different voltage domains. Elements belonging to the same voltage domain may operate by using the same power supply voltage and the same ground voltage. Elements belonging to different voltage domains may operate by using different power supply voltages and different ground voltages.

For example, a memory may generate a clock signal having a voltage lower than a voltage applied from the outside. The memory may ignore a noise occurring at an external voltage by generating a clock signal having a lower voltage. However, for a clock signal to be input to devices in the memory, it may be necessary to again increase a voltage level of the clock signal. The memory may again increase the voltage level of the clock signal by using a level shifter.

As such, the level shifter may convert a signal (e.g., a signal swinging between one power supply voltage and one ground voltage) belonging to one voltage domain into a signal (e.g., a signal swinging between another power supply voltage and another ground voltage) belonging to another voltage domain.

SUMMARY

Some example embodiments of the inventive concepts provide electronic devices including a level shifter capable of reducing distortion of a duty ratio of an output voltage.

According to an example embodiment, an electronic device may include a clock generator and a level shifter. The clock generator may output a clock signal swinging between a first voltage level and a second voltage level. When the clock signal having the second voltage level is received, the level shifter may be configured block an output of a first current from a supply voltage line to a first node regardless of a voltage level of an output node, output a second current from the first node to a ground voltage line, and output a third current from the supply voltage line to the output node based on a voltage level of the first node. The second voltage level may be higher than the first voltage level and may be lower than a voltage level of the supply voltage line.

According to an example embodiment, an electronic device may include a level shifting circuit, a first adjusting circuit, and a second adjusting circuit. The level shifting circuit may determine whether to output a first current from a supply voltage line to an output node based on a voltage level of a first node, and determine whether to output a second current from the supply voltage line to a third node based on a voltage level of a second node. The first adjusting circuit may block an output of a third current from the third node to the first node when a clock signal having a first voltage level is received. The second adjusting circuit may output a fourth current from the first node to a ground voltage line when the clock signal having the first voltage level is received. The clock signal may be a signal swinging between the first voltage level and a second voltage level lower than the first voltage level. The first voltage level may be lower than a voltage level of the supply voltage line.

According to an example embodiment, an electronic device may include a first PMOS transistor, a second PMOS transistor, a first NMOS transistor, a third PMOS transistor, and a second NMOS transistor. The first PMOS transistor may determine whether to connect a supply voltage line with a second node, based on a voltage level of a first node. The second PMOS transistor may determine whether to connect the second node with a third node, based on a clock signal swinging between a first voltage level and a second voltage level. The first NMOS transistor may determine whether to connect the third node with a ground voltage line, based on the clock signal. The third PMOS transistor may determine whether to connect the supply voltage line with an output node, based on a voltage level of the third node. The second NMOS transistor may determine whether to connect the first node with the ground voltage line, based on an inverted clock signal, a phase of the inverted clock signal corresponding to an inverted version of a phase of the clock signal. The first voltage level may be higher than the second voltage level and may be lower than a voltage level of the supply voltage line.

BRIEF DESCRIPTION OF THE FIGURES

The above and other objects and features of the inventive concept will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art easily implements the inventive concept.

Figure 1:
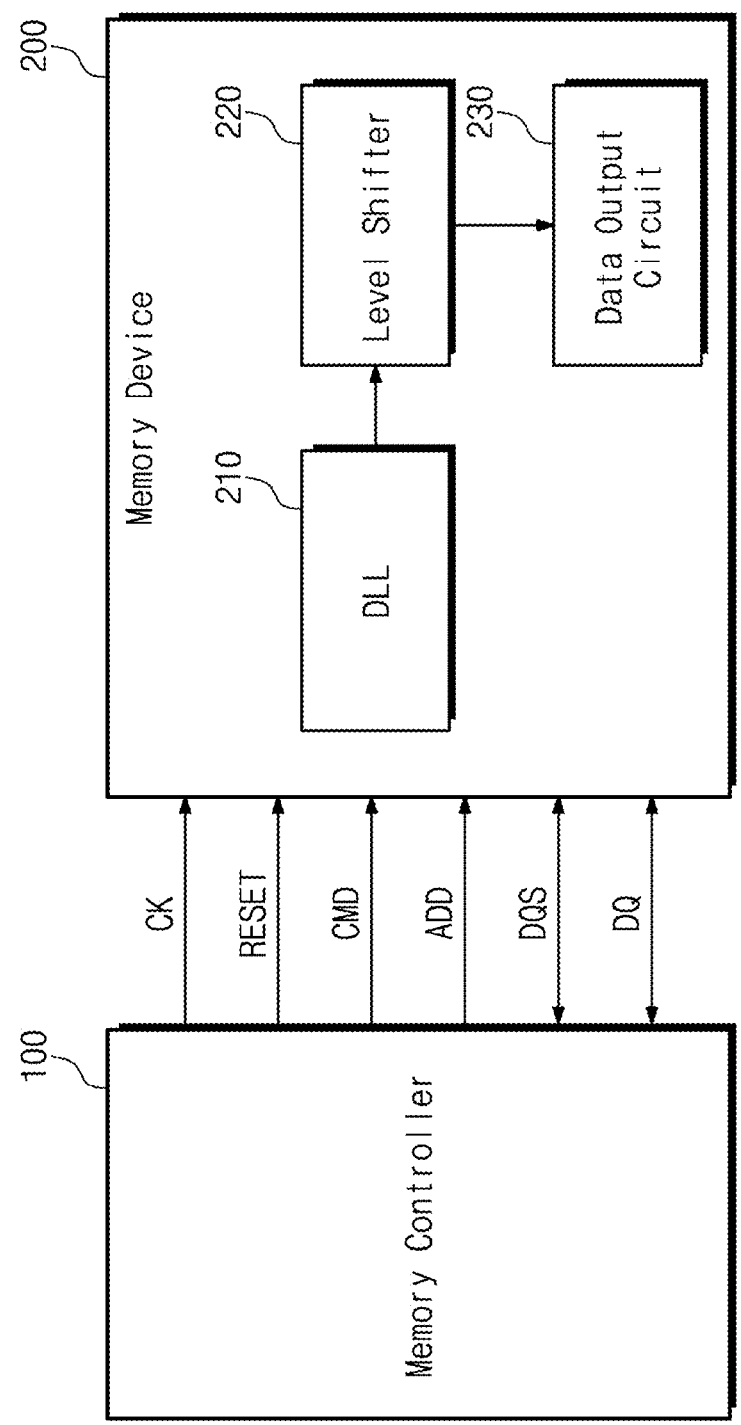
FIG. 1 is a block diagram of a semiconductor device according to an example embodiment of the inventive concepts.

FIG. 1 is a block diagram of a semiconductor device according to an example embodiment of the inventive concepts. Referring to FIG. 1, a semiconductor device 10 may include a memory controller 100 and a memory device 200.

The memory device 200 may receive a clock signal CK, a reset signal RESET, a command CMD, and an address ADD from the memory controller 100. The memory device 200 may operate in synchronization with the clock signal CK. In an example embodiment, the memory device 200 may be a dynamic random access memory (DRAM). However, the inventive concepts may not be limited thereto. For example, the memory device 200 may include a volatile memory, such as a static RAM (SRAM) or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

To describe an operation and an effect of the inventive concepts, a level shifter 220 included in the memory device 200 is illustrated in FIG. 1, but the inventive concepts are not limited thereto. A level shifter according to an example embodiment of the inventive concepts may mean an electronic circuit of an electronic device, which converts a signal belonging to one voltage domain into a signal belonging to another voltage domain.

After a power of the semiconductor device 10 is turned on, the memory controller 100 may transmit the reset signal RESET to the memory device 200. The memory device 200 may receive the reset signal RESET to perform a reset operation. The memory device 200 may perform an initialization operation depending on the reset operation. In some example embodiments, the memory device 200 may receive a separate initialization command together with the reset signal RESET to perform the initialization operation.

The memory device 200 may perform an operation corresponding to the command CMD. In an example embodiment, the command CMD may include an activate command ACT, a read command RD, and a write command WR. The memory device 200 may perform a read operation and a write operation based on the address ADD.

The memory device 200 may exchange a data strobe signal DQS and a data signal DQ with the memory controller 100. The memory controller 100 may output the data strobe signal DQS and the data signal DQ for the purpose of requesting the write operation from the memory device 200. Also, the memory controller 100 may output the clock signal CK and the command CMD for the purpose of requesting the read operation from the memory device 200. The memory device 200 may output the data strobe signal DQS and the data signal DQ based on the clock signal CK and the command CMD. For example, in the case of receiving a read command, the memory device 200 may delay the clock signal CK to generate the data strobe signal DQS. The memory device 200 may transmit the data signal DQ including read data to the memory controller 100 together with the data strobe signal DQS.

The memory device 200 may include a delay locked loop (DLL) 210, the level shifter 220, and a data output circuit 230. The delay locked loop 210 may delay the clock signal CK to output an internal clock signal. The level shifter 220 may regulate a voltage level of the internal clock signal output from the delay locked loop 210. The level shifter 220 may generate the data strobe signal DQS, based on the internal clock signal, of which the voltage level is regulated. The data output circuit 230 may output the data signal DQ together with the data strobe signal DQS. The data output circuit 230 may include a driver (not illustrated) for driving an output of each of signals.

Also, the data output circuit 230 may output the internal clock signal to components in the memory device 200. The components in the memory device 200 may operate in synchronization with the internal clock signal.

The delay locked loop 210 may output the internal clock signal by delaying the clock signal CK as much as a determined delay amount. A phase of the internal clock signal may be locked depending on the determined delay amount. The delay locked loop 210 may generate the internal clock signal by delaying the clock signal CK by using an external voltage applied from the outside. A voltage level of the internal clock signal may be different from a voltage level of the external voltage. For example, a voltage level of the internal clock signal may be lower than a voltage level of the external voltage. In the case where a voltage level of the external voltage is 1.5 V, a voltage level of the internal clock signal may be 1.1 V. Because the delay locked loop 210 decreases a voltage level of the external voltage to generate the internal clock signal, the delay locked loop 210 may not have an influence of a noise occurring at the external voltage.

For the components in the memory device 200 to operate based on the internal clock signal, it is desirable to again regulate the voltage level of the internal clock signal to the voltage level of the external voltage. The level shifter 220 may again increase the voltage level of the internal clock signal output from the delay locked loop 210. The components in the memory device 200 may operate in synchronization with the internal clock signal, of which the voltage level is regulated.

In the case where the unbalance between pull-up and pull-down of an output voltage increases in the process of regulating the voltage level of the internal clock signal, the components in the memory device 200 may abnormally operate. In the specification, the unbalance between pull-up and pull-down means that a difference between a time length desired for the pull-up and a time length desired for the pull-down is great. According to an example embodiment of the inventive concepts, a level shifter may pull up and pull down an output voltage more quickly depending on a change in an input voltage. Also, the level shifter may reduce the unbalance between pull-up and pull-down of an output voltage such that waveform distortion and duty ratio distortion of an output voltage decreases.

Figure 2:
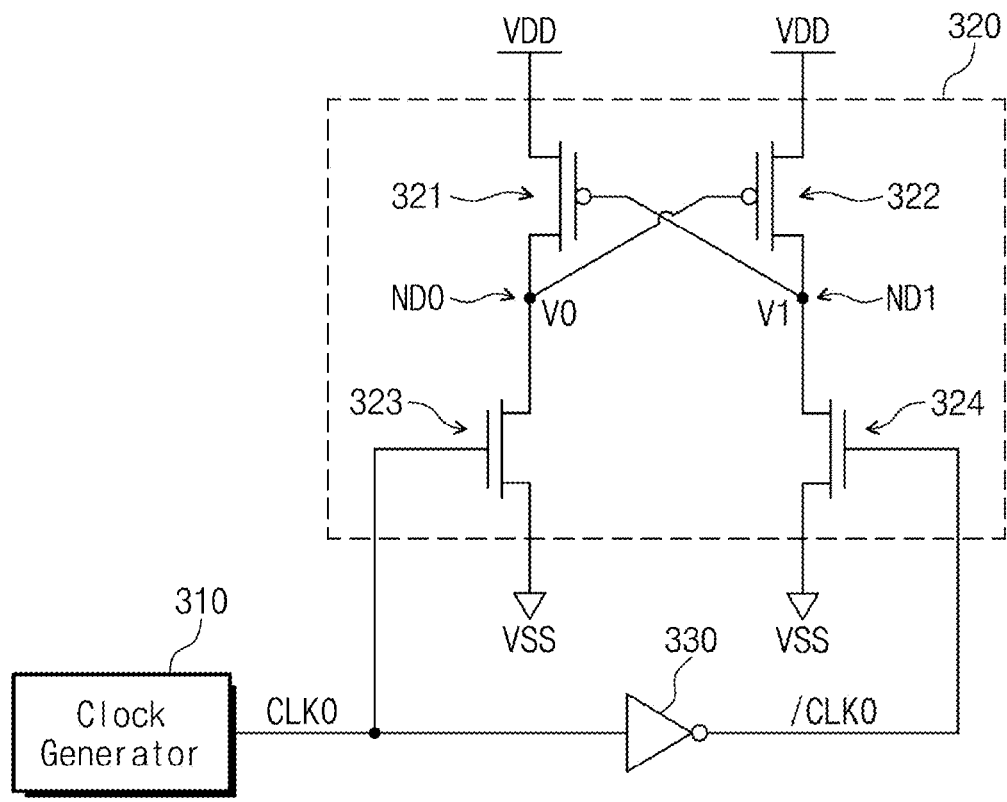
FIG. 2 is a block diagram illustrating a conventional level shifter.

FIG. 2 is a block diagram illustrating a conventional level shifter.

A clock generator 310 may output a clock signal CLK0 swinging between a first voltage level and a second voltage level. The second voltage level may be higher than the first voltage level. The clock signal CLK0 generated from the clock generator 310 may be input to a level shifter 320.

The level shifter 320 may receive the clock signal CLK0, a supply voltage VDD, and a ground voltage VSS. The level shifter 320 may output a voltage V1, based on the clock signal CLK0, the supply voltage VDD, and the ground voltage VSS. A voltage level difference of the supply voltage VDD and the ground voltage VSS may be greater than a difference between the first voltage level and the second voltage level. In descriptions below, it is assumed that the voltage level of the supply voltage VDD is higher than the second voltage level and the voltage level of the ground voltage VSS is equal to the first voltage level, but the inventive concepts are not limited thereto.

The voltage V1 may be in the form of a clock signal swinging between specific voltages. As the clock signal CLK0 transitions, the voltage V1 may repeat a rising transition and a falling transition. A voltage level of the voltage V1 pulled up may be higher than the second voltage level. In descriptions below, it is assumed that the voltage level of the voltage V1 pulled up is equal to the voltage level of the supply voltage VDD, but the inventive concepts are not limited thereto. The voltage level of the voltage V1 pulled up may be a voltage level between the second voltage level and the voltage level of the supply voltage VDD.

A voltage level difference of the voltage V1 pulled up and the voltage V1 pulled down may be greater than a difference between the first voltage level and the second voltage level. In descriptions below, it is assumed that the voltage level of the voltage V1 pulled up is higher than the second voltage level and the voltage level of the voltage V1 pulled down is equal to the first voltage level, but the inventive concepts are not limited thereto.

The level shifter 320 may include transistors 321 to 324. The transistors 321 and 322 may be cross-coupled and may be PMOS transistors. The transistors 323 and 324 may be connected with the transistors 321 and 322, respectively, and may be NMOS transistors.

The transistor 321 may be placed between a supply voltage (VDD) line and the transistor 323. A source terminal, a drain terminal, and a gate terminal of the transistor 321 may be connected with the supply voltage (VDD) line, a gate terminal of the transistor 323, and a node ND1, respectively. The transistor 321 may determine whether to output a current from the supply voltage (VDD) line to the transistor 323, based on a voltage level of the voltage V1. The voltage V1 means a voltage of the node ND1.

The transistor 322 may be placed between the supply voltage (VDD) line and the transistor 324. A source terminal, a drain terminal, and a gate terminal of the transistor 322 may be connected with the supply voltage (VDD) line, a gate terminal of the transistor 324, and a node ND0, respectively. The transistor 322 may determine whether to output a current from the supply voltage (VDD) line to the transistor 324, based on a voltage level of a voltage V0. The voltage V0 means a voltage of the node ND0.

The transistor 323 may be connected between the transistor 321 and a ground voltage (VSS) line. A source terminal and a drain terminal of the transistor 323 may be connected with the ground voltage (VSS) line and the transistor 321, respectively. The clock signal CLK0 may be input to a gate terminal of the transistor 323. The transistor 323 may determine whether to output a current from the transistor 321 to the ground voltage (VSS) line, based on a voltage level of the clock signal CLK0.

The transistor 324 may be connected between the transistor 322 and the ground voltage (VSS) line. A source terminal and a drain terminal of the transistor 324 may be connected with the ground voltage (VSS) line and the transistor 322, respectively. An inverted clock signal /CLK0 may be input to a gate terminal of the transistor 324. The inverted clock signal /CLK0 may be an output signal of an inverter 330, which has a phase corresponding to an inverted version of a phase of the clock signal CLK0. The transistor 324 may determine whether to output a current from the transistor 322 to the ground voltage (VSS) line, based on a voltage level of the inverted clock signal /CLK0.

The voltage level of the voltage V0 may be regulated by the operations of the transistors 321 and 323, and the voltage level of the voltage V1 may be regulated by the operations of the transistors 322 and 324. Because the operation of the transistor 322 is determined depending on the voltage V0, the voltage level of the voltage V1 may be regulated after the voltage level of the voltage V0 is regulated. In the case where the clock signal CLK0 having the second voltage level is input to the level shifter 320, because a current flows from the transistor 321 to the node ND0 for a while, a speed at which the voltage level of the voltage V0 decreases may become slow. Because a current starts to flow to the node ND1 after the voltage level of the voltage V0 is decreased, a lot of time may be taken for the voltage level of the voltage V1 to increase.

In the case where the clock signal CLK0 having the first voltage level is input to the level shifter 320, unlike when the clock signal CLK0 having the second voltage level is input to the level shifter 320, the voltage level of the voltage V0 may be regulated after the voltage level of the voltage V1 is regulated. Accordingly, a time taken for the voltage level of the voltage V1 to fall to a target level may be shorter than a time taken for the voltage level of the voltage V1 to rise to a target level. In this case, the unbalance between the pull-up and the pull-down of the voltage V1 occurs, and thus, a waveform and a duty ratio of an output voltage are distorted.

Figure 3:
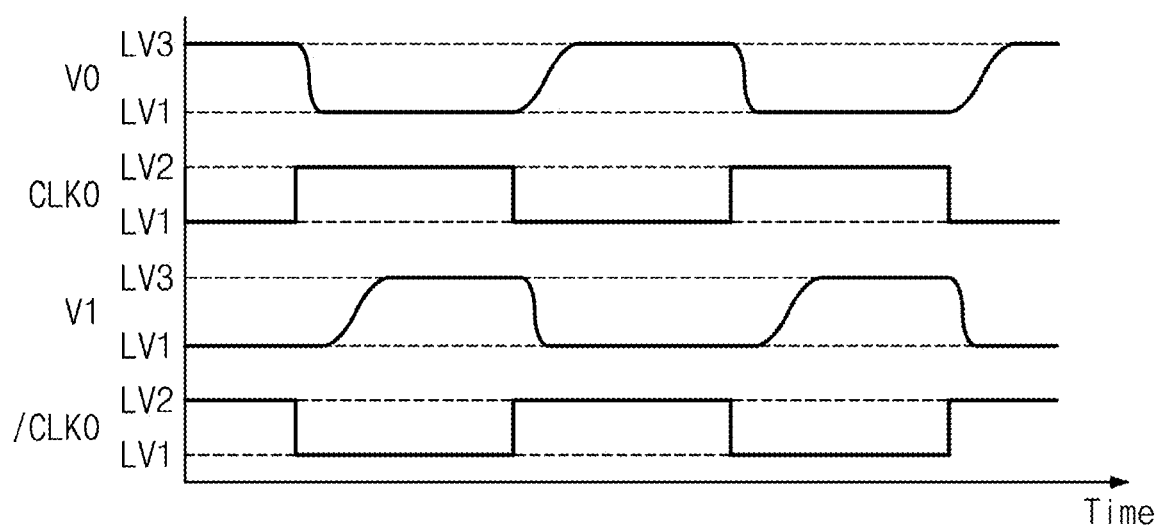
FIG. 3 is a graph for describing waveform distortion of an output voltage occurring at a level shifter of FIG. 2.

FIG. 3 is a graph for describing waveform distortion of an output voltage occurring at a level shifter of FIG. 2. An output voltage means the voltage V1 of FIG. 2.

As described with reference to FIG. 2, even though the clock signal CLK0 having the second voltage level LV2 is input to the level shifter 320, because a current flows from the transistor 321 to the node ND0 for a while, the voltage level of the voltage V0 may decrease slowly. Also, because a current starts to flow to the node ND1 after the voltage level of the voltage V0 is decreased, a lot of time may be taken for the voltage level of the voltage V1 to increase. The voltage V1 may be regulated through an operation of the level shifter 320 so as to have a third voltage level LV3. The third voltage level LV3 may be the voltage level of the supply voltage VDD.

In contrast, in the case where the clock signal CLK0 having the first voltage level LV1 is input to the level shifter 320, unlike when the clock signal CLK0 having the second voltage level LV2 is input to the level shifter 320, the voltage level of the voltage V0 may be regulated after the voltage level of the voltage V1 is regulated. Accordingly, a time taken for the voltage level of the voltage V1 to fall to a target level may be shorter than a time taken for the voltage level of the voltage V1 to rise to a target level. The voltage V1 may be regulated through the operation of the level shifter 320 so as to have a first voltage level LV1. The first voltage level LV1 may be the voltage level of the ground voltage VSS. A waveform of the voltage V1 may be distorted due to the unbalance between a time taken for the voltage level of the voltage V1 to rise to a target level and a time taken for the voltage level of the voltage V1 to fall to a target level. It is observed from graphs illustrated in FIG. 3 that the time taken for the voltage level of the voltage V1 to rise to a target level and the time taken for the voltage level of the voltage V1 to fall to a target level are unbalanced.

Figure 4:
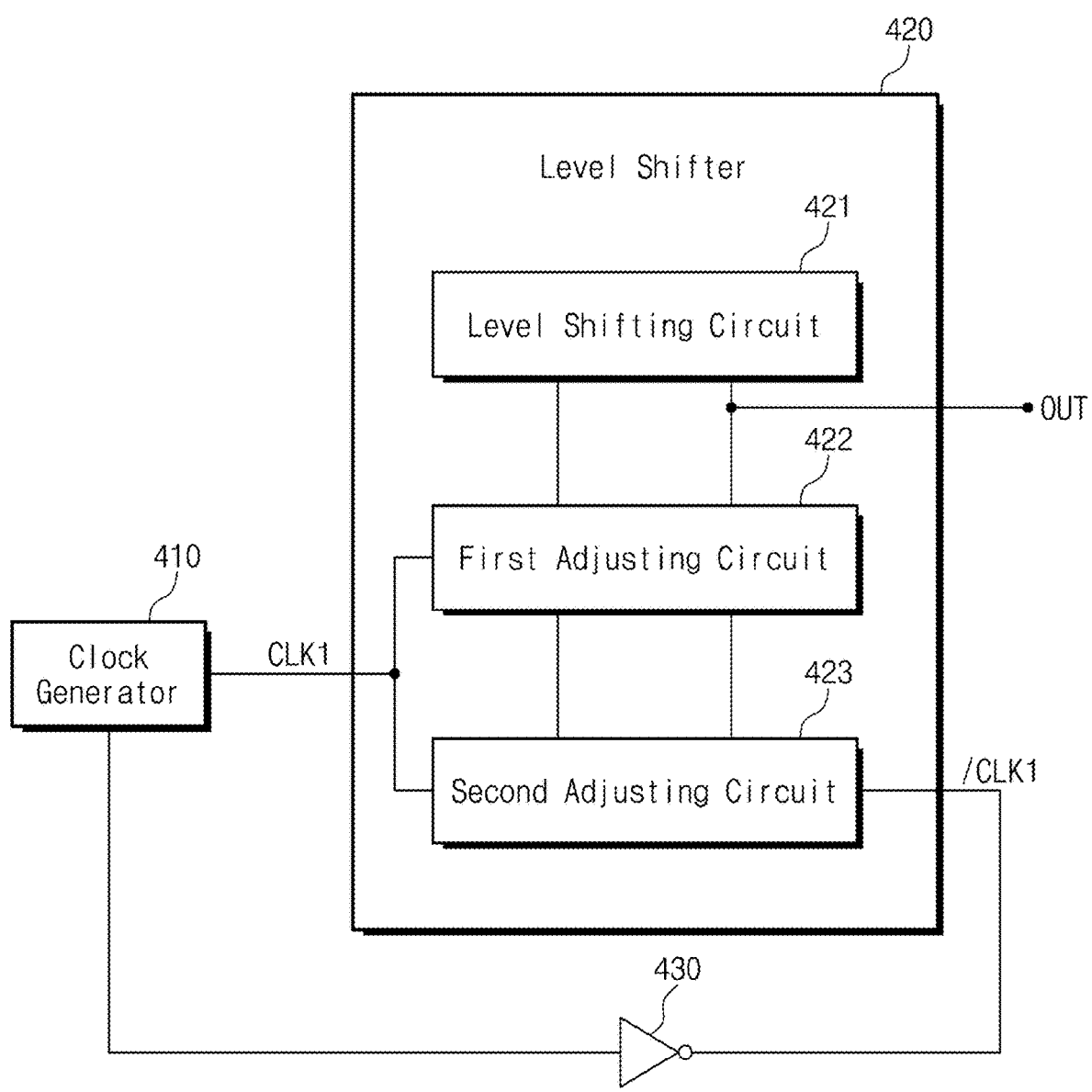
FIG. 4 is a block diagram illustrating a level shifter according to an example embodiment of the inventive concepts.

FIG. 4 is a block diagram illustrating a level shifter according to an example embodiment of the inventive concepts.

A level shifter 420 may be included in the level shifter 220 of FIG. 1. A clock generator 410 may correspond to the delay locked loop 210 of FIG. 1.

The clock generator 410 may output a clock signal CLK1 swinging between the first voltage level LV1 and a second voltage level LV2. The second voltage level LV2 may be higher than the first voltage level LV1. The clock signal CLK1 generated from the clock generator 410 may be input to the level shifter 420.

The level shifter 420 may receive the clock signal CLK1, a supply voltage VDD, and a ground voltage VSS. The level shifter 420 may output an output voltage to an output terminal OUT, based on the clock signal CLK1, the supply voltage VDD, and the ground voltage VSS. As the clock signal CLK1 transitions, the output voltage V1 may repeat a rising transition and a falling transition. That the output voltage has the rising transition may be expressed as the output voltage is pulled up. That the output voltage has the falling transition may be expressed as the output voltage is pulled down.

In descriptions below, it is assumed that a voltage level of the pulled-up output voltage is equal to the voltage level of the supply voltage VDD, but the inventive concepts are not limited thereto. The voltage level of the pulled-up output voltage may be a voltage level between the second voltage level LV2 and the voltage level of the supply voltage VDD.

A voltage level difference of the pulled-up output voltage and the pulled-down output voltage may be greater than a difference between the first voltage level LV1 and the second voltage level LV2. In descriptions below, it is assumed that the voltage level of the pulled-up output voltage is higher than the second voltage level LV2 and the voltage level of the pulled-down output voltage is equal to the first voltage level LV1, but the inventive concepts are not limited thereto.

Also, in descriptions below, it is assumed that the level shifter 420 is a level shifter that receives a low-voltage signal and outputs a high-voltage signal, but the inventive concepts are not limited thereto. The level shifter 420 may be a level shifter that receives a high-voltage signal and outputs a low-voltage signal, The level shifter 420 may include a level shifting circuit 421, a first adjusting circuit 422, and a second adjusting circuit 423.

The level shifting circuit 421 may receive the supply voltage VDD and may pull up a voltage level of the output voltage to the voltage level of the supply voltage VDD. The level shifting circuit 421 may include a plurality of transistors, and a configuration of the level shifting circuit 421 will be more fully described with reference to FIG. 5.

The first adjusting circuit 422 may determine whether to output a current to the second adjusting circuit 423, based on the clock signal CLK1. A speed at which the output voltage is regulated may vary depending on whether a current is output to the second adjusting circuit 423. The first adjusting circuit 422 may include a plurality of transistors, and a configuration of the first adjusting circuit 422 will be more fully described with reference to FIG. 5.

The second adjusting circuit 423 may determine whether to output a current to the ground voltage (VSS) line, based on the clock signal CLK1 and an inverted clock signal /CLK1. A speed at which the output voltage is regulated may vary depending on whether a current is output to the ground voltage (VSS) line. The second adjusting circuit 423 may include a plurality of transistors, and a configuration of the second adjusting circuit 423 will be more fully described with reference to FIG. 5.

Figure 5:
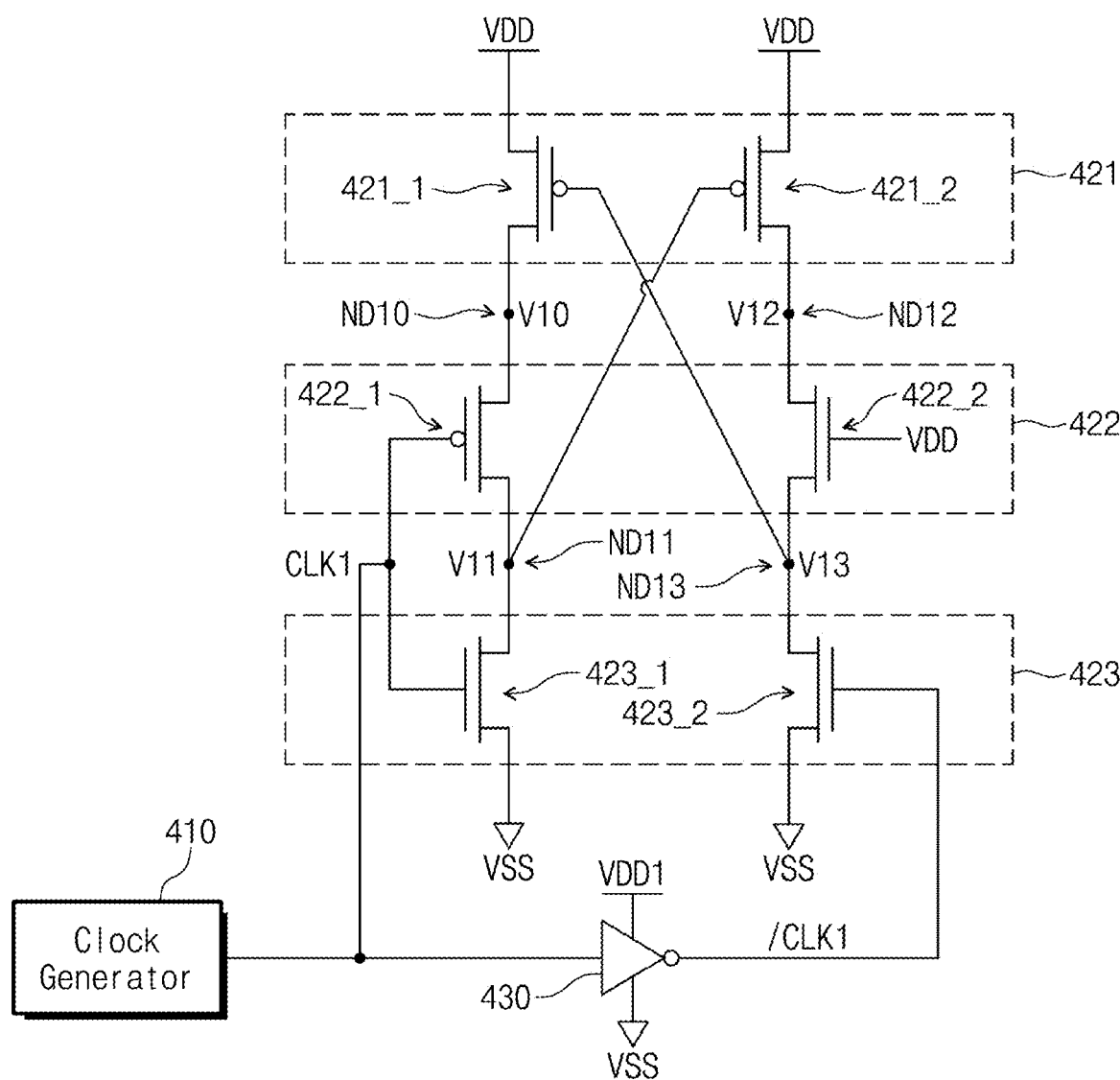
FIG. 5 is a circuit diagram illustrating a level shifter of FIG. 4.

FIG. 5 is a circuit diagram illustrating a level shifter of FIG. 4. The level shifting circuit 421, the first adjusting circuit 422, and the second adjusting circuit 423 of FIG. 5 may be included in the level shifter 420 of FIG. 4.

The level shifting circuit 421 may include transistors 421_1 and 421_2. In descriptions below, it is assumed that the transistors 421_1 and 421_2 are PMOS transistors, but the inventive concepts are not limited thereto. The transistors 421_1 and 421_2 may be replaced with switches determining whether to switch based on voltages V10 and V12.

Source terminals of the transistors 421_1 and 421_2 may be connected with the supply voltage (VDD) line. A drain terminal of the transistor 421_1 may be connected with a source terminal of a transistor 422_1, and a drain terminal of the transistor 421_2 may be connected with a drain terminal of a transistor 422_2. Gate terminals of the transistors 421_1 and 421_2 may be connected with nodes ND13 and ND11, respectively. The transistors 421_1 and 421_2 may determine whether to output currents to the transistors 422_1 and 422_2, based on the voltages V13 and V11 input to the gate terminals of the transistors 421_1 and 421_2.

The first adjusting circuit 422 may include the transistors 422_1 and 422_2. In descriptions below, it is assumed that the transistor 422_1 is a PMOS transistor and the transistor 422_2 is an NMOS transistor, but the inventive concepts are not limited thereto. The transistors 422_1 and 422_2 may be replaced with switches determining whether to switch based on the clock signal CLK1 and the supply voltage VDD, respectively.

The source terminal and a drain terminal of the transistor 422_1 may be connected with the drain terminal of the transistor 421_1 and a drain terminal of a transistor 423_1. The clock signal CLK1 may be input to a gate terminal of the transistor 422_1. The transistor 422_1 may determine whether to output a current to the transistor 423_1, based on a voltage level of the clock signal CLK1. The drain terminal and a source terminal of the transistor 422_2 may be connected with the drain terminal of the transistor 421_2 and a drain terminal of a transistor 423_2, respectively. The supply voltage VDD may be input to a gate terminal of the transistor 422_2. Accordingly, the transistor 422_2 may output a current to the transistor 423_2 regardless of the clock signal CLK1. In other words, the transistor 422_2 may enable a current to flow between the node ND12 (or alternatively, an output node) and the node ND13, regardless of the clock signal CLK1.

The second adjusting circuit 423 may include the transistors 423_1 and 423_2. In descriptions below, it is assumed that the transistors 423_1 and 423_2 are NMOS transistors, but the inventive concepts are not limited thereto. The transistors 423_1 and 423_2 may be replaced with switches determining whether to switch based on the clock signal CLK1 and the inverted clock signal /CLK1.

The inverted clock signal /CLK1 may be an output signal of an inverter 430, which has a phase corresponding to an inverted version of a phase of the clock signal CLK1. The inverter 430 may operate in the same voltage domain as the clock generator 410. For example, in the case where the clock generator 410 operates based on a voltage VDD1 and a voltage VSS, the inverter 430 may also operate based on the voltage VDD1 and the voltage VSS. In this case, a level of the voltage VDD1 may be lower than a level of the supply voltage VDD.

The drain terminal of the transistor 423_1 may be connected with the drain terminal of the transistor 422_1, and the drain terminal of the transistor 423_2 may be connected with the source terminal of the transistor 422_2. Source terminals of the transistors 423_1 and 423_2 may be connected with the ground voltage (VSS) line. The clock signal CLK1 may be input to a gate terminal of the transistor

423_1, and the inverted clock signal /CLK1 may be input to a gate terminal of the transistor 423_2. The transistors 423_1 and 423_2 may determine whether to output currents to the ground voltage (VSS) line, based on the clock signal CLK1 and the inverted clock signal /CLK1.

A rising transition of the voltage V12 will be described below. As soon as the clock signal CLK1 having the second voltage level LV2 is received, the transistor 423_1 may output a current from a node ND11 to the ground voltage (VSS) line. As soon as the clock signal CLK1 having the second voltage level LV2 is received, the transistor 422_1 may block the output of a current to the node ND11. Because a current does not flow to the node ND11, a voltage level of the voltage V11 may decrease by the transistor 423_1, regardless of whether the transistor 421_1 outputs a current. Accordingly, when the clock signal CLK1 having the second voltage level LV2 is input to the level shifter 420, a voltage level of the voltage V11 may be decreased more quickly. As the voltage level of the voltage V11 is decreased more quickly, a time taken for the transistor 421_2 to output a current to a node ND12 may be decreased. In other words, the level shifter of FIG. 5 is configured to block an output of a current from a supply voltage (VDD) line to the node ND11 regardless of a voltage level of the node ND12 (or alternatively, an output node), output a current from the node ND11 to a ground voltage (VSS) line, and output a current from the supply voltage (VDD) line to the node ND12 based on a voltage level of the node ND11, when the clock signal having the second voltage level is received. The second voltage level may be lower than a voltage level of the supply voltage (VDD) line.

As soon as the inverted clock signal /CLK1 having the first voltage level LV1 is received, the transistor 423_2 may block the output of a current to the ground voltage (VSS) line. Because the output of a current from the node ND12 to the ground voltage (VSS) line is blocked and a current flows to the node ND12 through the transistor 421_2, a voltage level of the voltage V12 may be increased more quickly.

A falling transition of the voltage V12 will be described below. As soon as the clock signal CLK1 having the first voltage level LV1 is received, the transistor 423_1 may block the output of a current from the node ND11 to the ground voltage (VSS) line. As soon as the clock signal CLK1 having the first voltage level LV1 is received, the transistor 422_1 may output a current from a node ND10 to the node ND11. Accordingly, a voltage level of the voltage V11 may increase. As the voltage level of the voltage V11 increases, the transistor 421_2 may block the output of a current to the node ND12.

As soon as the inverted clock signal /CLK1 having the second voltage level LV2 is received, the transistor 423_2 may output a current from the node ND13 to the ground voltage (VSS) line. The transistor 422_2 may output a current from the node ND12 to the node ND13 regardless of a voltage level of the inverted clock signal /CLK1. Because the output of a current to the node ND12 is blocked by the transistor 421_2 and a current flows from the node ND12 to the ground voltage (VSS) line, a voltage level of the voltage V12 may decrease. In other words, the level shifter of FIG. 5 is configured to block an output of a current to the node ND12 (or alternatively, an output node) based on the voltage level of the node ND11, and output a current from the node ND12 to the ground voltage (VSS) line regardless of the voltage level of the node ND11, when the inverted clock signal /CLK1 having the second voltage level is received.

Because a time taken for the voltage V12 to have a rising transition decreases, the unbalance between times when the voltage V12 has a rising transition and a falling transition may decrease. Also, waveform distortion and duty ratio distortion of the voltage V12 may decrease.

The level shifter 420 may additionally mitigate or prevent the waveform distortion and the duty ratio distortion of the voltage V12 by using the transistor 422_2. The transistor 422_2 may further reduce the unbalance between times when the voltage V12 has a rising transition and a falling transition by adjusting a speed at which a current flows from the node ND12 to the node ND13. For example, the level shifter 420 may include the transistor 422_2 having a capacity that is appropriate to reduce the duty ratio distortion.

Figure 6:
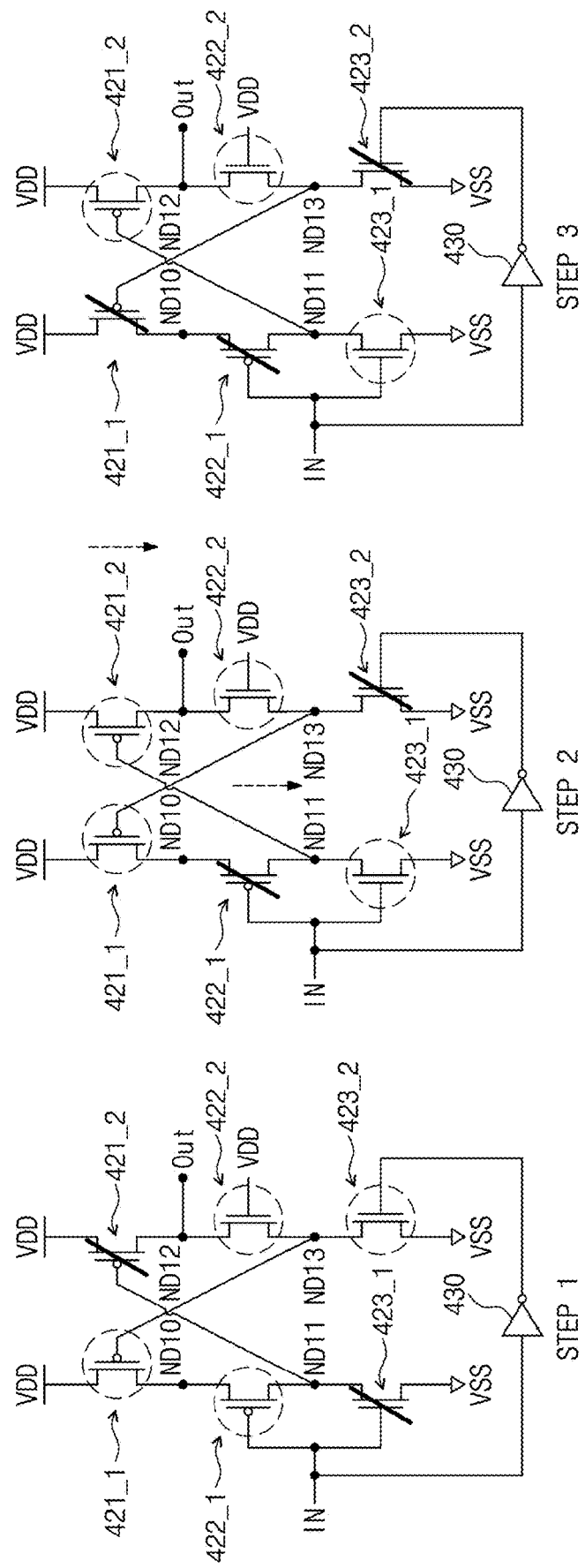
FIG. 6 is a diagram for describing how an output voltage of FIG. 5 has a rising transition.

FIG. 6 is a diagram for describing how an output voltage of FIG. 5 has a rising transition. An output voltage means a voltage of the node ND12.

Operations of a level shifter illustrated in FIG. 5 when the clock signal CLK1 having the first voltage level LV1 is received in a first step "STEP 1" and then the clock signal CLK1 having the second voltage level LV2 is received in a second step "STEP 2" will be described with reference to FIG. 6.

In the first step "STEP 1", because the clock signal CLK1 having the first voltage level LV1 and the inverted clock signal /CLK1 having the second voltage level LV2 are input to the level shifter, a voltage level of the output voltage may be maintained at the first voltage level LV1.

In the second step "STEP 2", a voltage level of the clock signal CLK1 that is input to the level shifter may switch. In the second step "STEP 2", the clock signal CLK1 having the second voltage level LV2 and the inverted clock signal /CLK1 having the first voltage level LV1 may be input to the level shifter. As soon as the clock signal CLK1 having the second voltage level LV2 is input to the level shifter, the transistor 423_1 may output a current from the node ND11 to the ground voltage (VSS) line. In this case, a voltage level of the node ND11 may be decreased. As the voltage level of the voltage V1 is decreased, a current may flow to the node ND12 through the transistor 421_2. In this case, a voltage level of the output voltage may increase to the third voltage level LV3.

In a third step "STEP 3", a voltage level of the clock signal CLK1 that is input to the level shifter may be maintained at the second voltage level LV2. In this case, the voltage level of the output voltage may be maintained at the third voltage level LV3.

Figure 7:
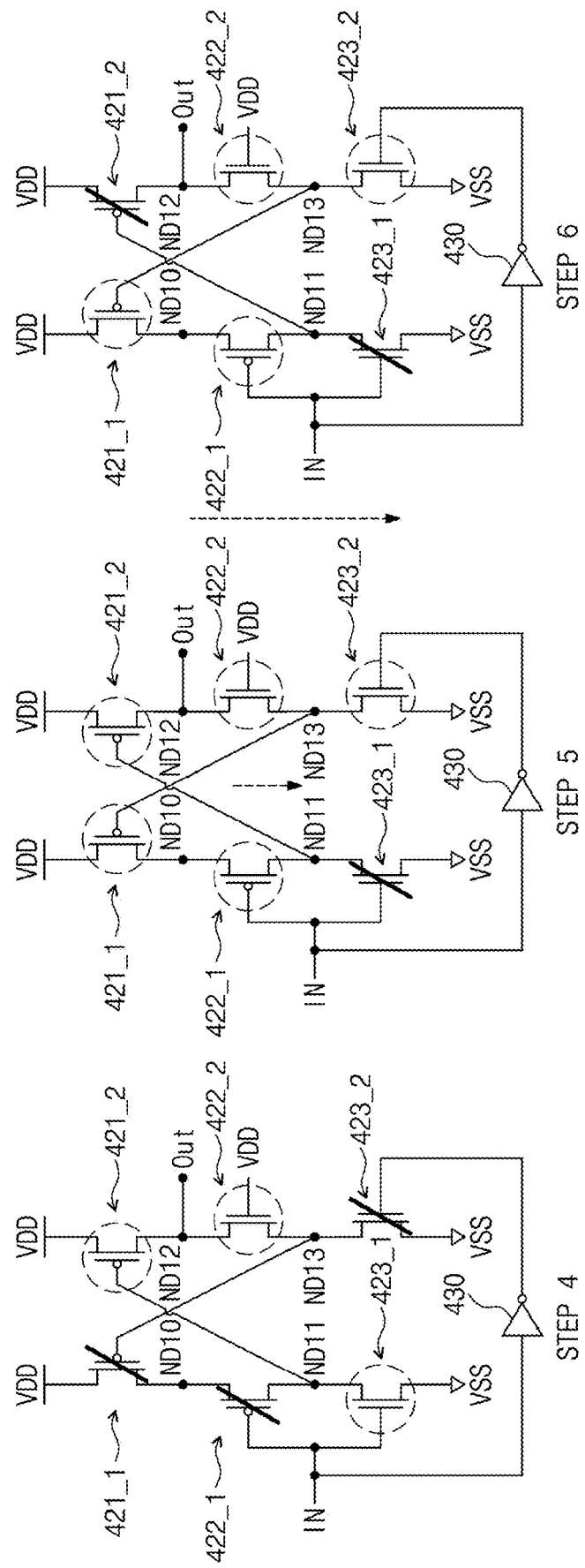
FIG. 7 is a diagram for describing how an output voltage of FIG. 5 has a falling transition.

FIG. 7 is a diagram for describing how an output voltage of FIG. 5 has a falling transition. An output voltage means a voltage of the node ND12.

Operations of a level shifter illustrated in FIG. 5 when the clock signal CLK1 having the second voltage level LV2 is received in a fourth step "STEP 4" and then the clock signal CLK1 having the first voltage level LV1 is received in a fifth step "STEP 5" will be described with reference to FIG. 7.

In the fourth step "STEP 4", because the clock signal CLK1 having the second voltage level LV2 and the inverted clock signal /CLK1 having the first voltage level LV1 are input to the level shifter, a voltage level of the output voltage may be maintained at the third voltage level LV3.

In the fifth step "STEP 5", a voltage level of the clock signal CLK1 that is input to the level shifter may switch. In the fifth step "STEP 5", the clock signal CLK1 having the first voltage level LV1 and the inverted clock signal /CLK1 having the second voltage level LV2 may be input to the level shifter. As soon as the clock signal CLK1 having the first voltage level LV1 is input to the level shifter, the transistor 422_1 may output a current to the node ND11. In this case, a voltage level of the node ND11 may be increased. As the voltage level of the node ND is increased, the output of a current to the node ND12 may be blocked by the transistor 421_2. As soon as the inverted clock signal /CLK1 having the second voltage level LV2 is input to the level shifter, a current may flow from the node ND12 to the ground voltage (VSS) line through the transistors 422_2 and 423_2. In this case, a voltage level of the output voltage may decrease to the first voltage level LV1.

In a sixth step "STEP 6", a voltage level of the clock signal CLK1 that is input to the level shifter may be maintained at the first voltage level LV1. In this case, the voltage level of the output voltage may be maintained at the first voltage level LV1.

Figure 8:
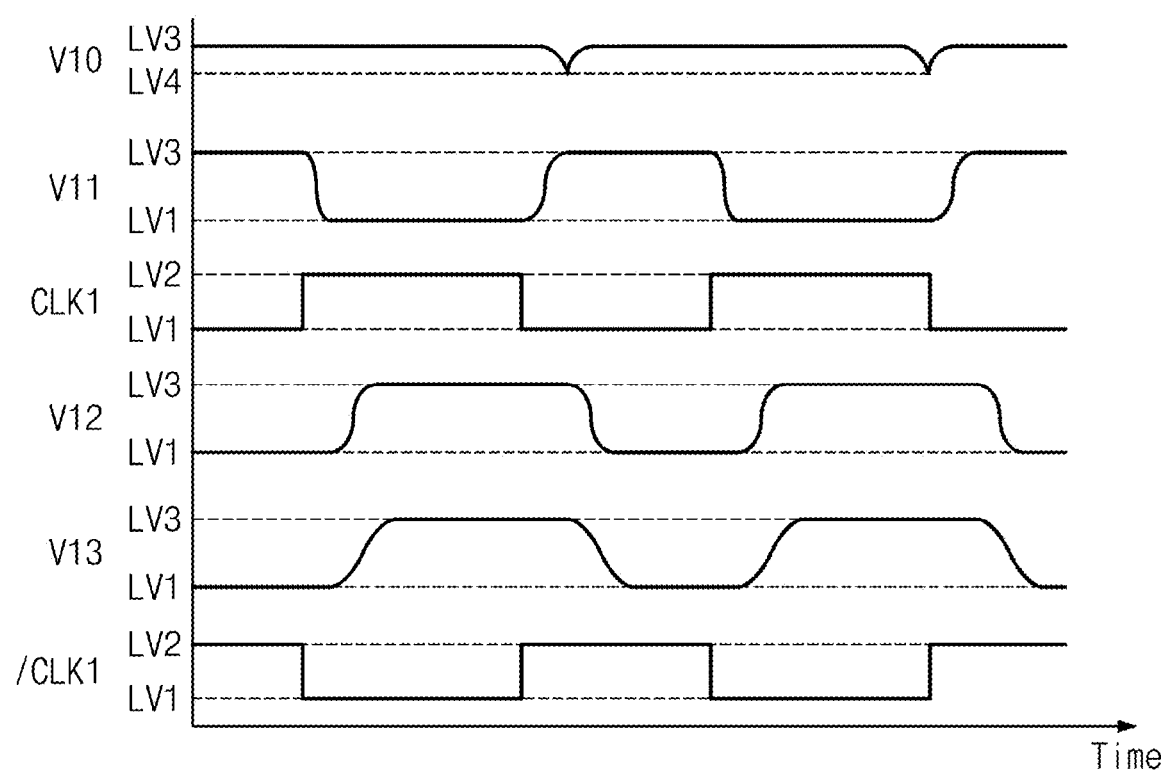
FIG. 8 is a graph illustrating a waveform of an output voltage of FIG. 5.

FIG. 8 is a graph illustrating a waveform of an output voltage of FIG. 5. An output voltage means the voltage V12 of FIG. 5.

As described with reference to FIG. 5, as soon as the clock signal CLK1 having the second voltage level LV2 is input to the level shifter 420, a voltage level of the voltage V11 may decrease. In this case, the voltage level of the voltage V11 may decrease regardless of a voltage level of the voltage V10. When the voltage level of the voltage V11 reaches the first voltage level LV1, a voltage level of the voltage V12 may increase.

As soon as the clock signal CLK1 having the first voltage level LV1 is input to the level shifter 420, a voltage level of the voltage V11 may increase. In this case, a voltage level of the voltage V10 may decrease to a fourth voltage level LV4. The fourth voltage level LV4 may be lower than the third voltage level LV3 and may be higher than the second voltage level LV2. The voltage level of the voltage V11 may increase regardless of a voltage level of the voltage V10. When the voltage level of the voltage V11 reaches the third voltage level LV3, a voltage level of the voltage V12 may decrease.

That is, a speed at which the voltage level of the voltage V12 increases may be equal to a speed at which the voltage level of the voltage V12 decreases. It is observed from graphs illustrated in FIG. 8 that the unbalance between the time taken for the voltage level of the voltage V12 to rise to a target level and the time taken for the voltage level of the voltage V1 to fall to a target level is decreased.

Figure 9:
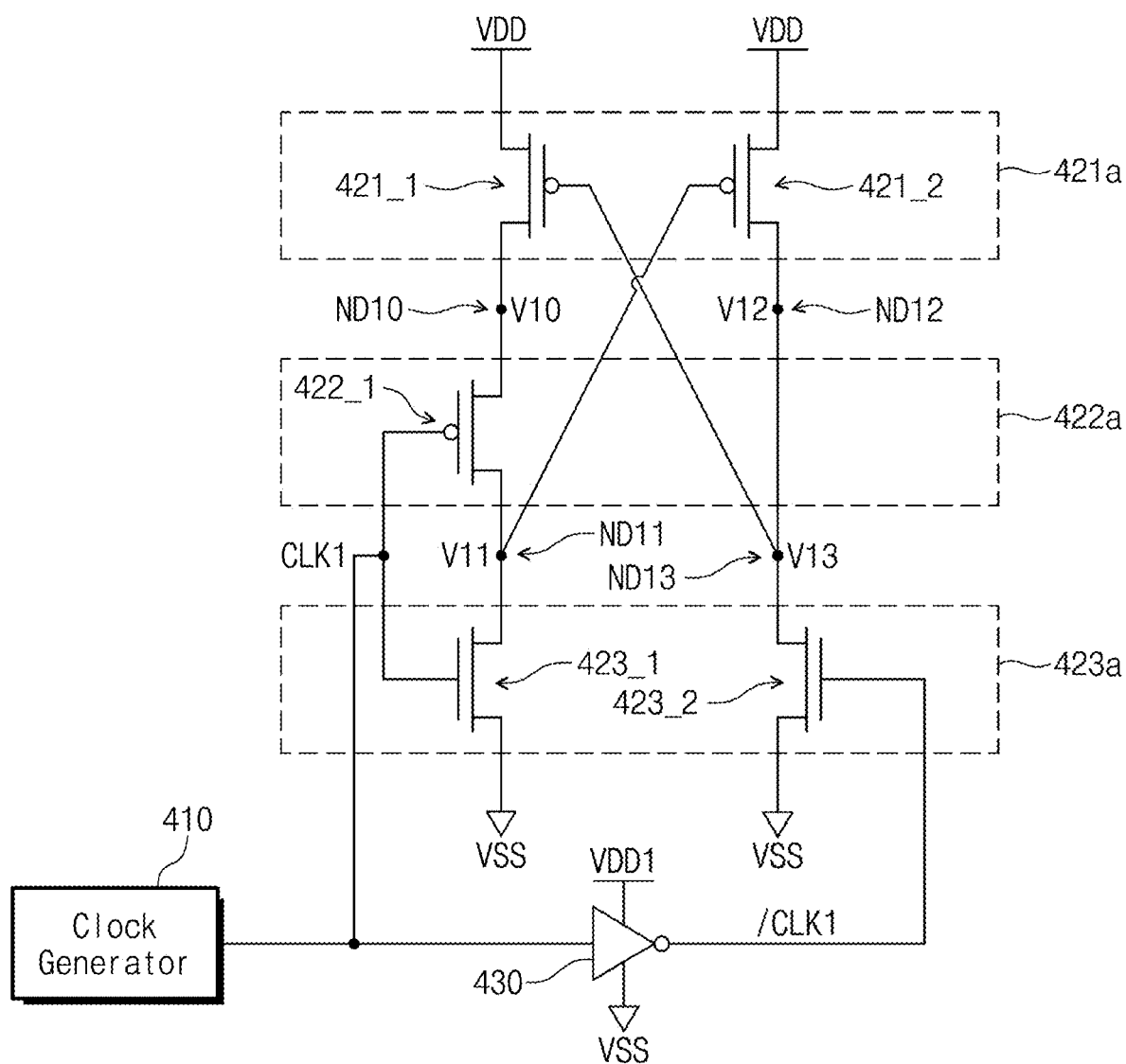
FIG. 9 is a circuit diagram illustrating an embodiment of a level shifter of FIG. 4.

FIG. 9 is a circuit diagram illustrating an example embodiment of a level shifter of FIG. 4. A level shifting circuit 421a, a first adjusting circuit 422a, and a second adjusting circuit 423a of FIG. 9 may be included in the level shifter 420 of FIG. 4.

Unlike the first adjusting circuit 422 of FIG. 5, the first adjusting circuit 422a may not include the transistor 422_2. The circuits 421a, 422a, and 423a of FIG. 9 provide the same or substantially similar operations as the circuits 421, 422, and 423 of FIG. 5 except that the first adjusting circuit 422a does not include the transistor 422_2, and thus additional description will be omitted to avoid redundancy. In some example, embodiments, the level shifter of FIG. 9 may further includes an NMOS transistor, which is configured to enable a current to flow between the node ND12 and the node ND13, regardless of the clock signal CLK1. In other words, the level shifter of FIG. 9 may further includes an NMOS transistor, which is configured to electrically connect the node ND12 with the node ND13, based on a voltage level of the supply voltage line.

Figure 10:
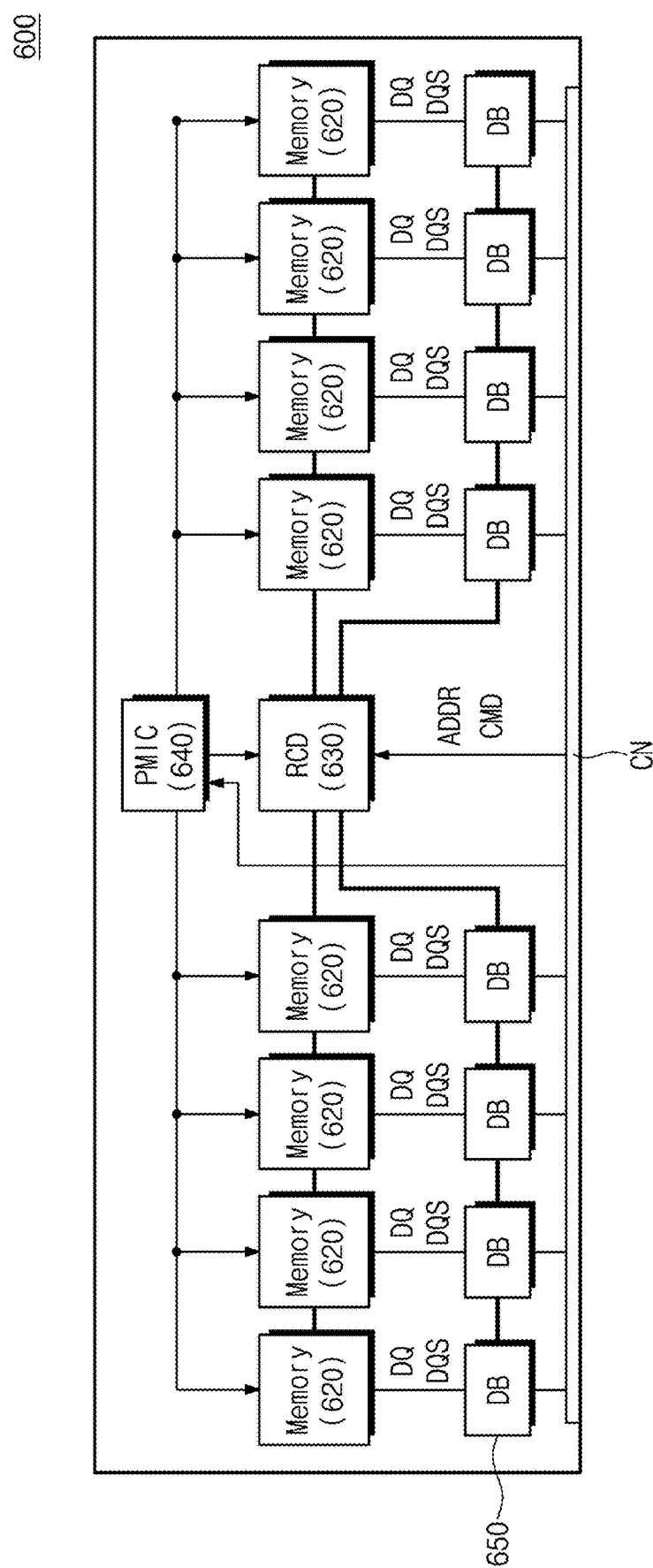
FIG. 10 illustrates a memory module according to an example embodiment of the inventive concepts.

FIG. 10 illustrates a memory module 600 according to an example embodiment of the inventive concepts. The memory module 600 may include memories 620, a driver (RCD) 630, a power management integrated circuit (PMIC) 640, buffers (DB) 650, and a connector CN on a printed circuit board. The power management integrated circuit 640 may supply a power to the memories 620, the driver 630, and the buffers 650. The driver 630 may receive the address ADDR and the command CMD and may control the memories 620 and the buffers 650. The memories 620 may exchange data DQ and the data strobe signal DQS with an external device through the buffers 650. Each of the driver 630 and the buffers 650 may include the level shifter 420 of FIG. 4. The driver 630 and the buffers 650 may regulate levels of voltages used therein by using the level shifter 420. For example, the driver 630 may operate in a voltage domain lower than the supply voltage VDD for the purpose of generating a control signal in response to the address ADDR and the command CMD. Before outputting the control signal to the memories 620 and the buffers 650, the driver 630 may make a voltage domain of the control signal high, by using the level shifter 420.

According to some example embodiments of the inventive concepts, a level shifter may pull up and pull down an output voltage more quickly depending on a change in an input voltage. Also, the level shifter may reduce or mitigate the unbalance between pull-up and pull-down of an output voltage such that waveform distortion and duty ratio distortion of the output voltage decreases.

The units and/or circuits described herein may be implemented using hardware components and a combination of software components and hardware component. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a processing device may include multiple processors or a processor and a controller. In addition, different processing configurations are possible, such as parallel processors, multi-core processors, distributed processing, or the like.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. An electronic device comprising:
   a clock generator configured to output a clock signal swinging between a first voltage level and a second voltage level; and
   a level shifter, configured to block an output of a first current from a supply voltage line to a first node regardless of a voltage level of an output node, output a second current from the first node to a ground voltage line, and output a third current from the supply voltage line to the output node based on a voltage level of the first node, when the clock signal having the second voltage level is received, wherein the second voltage level is higher than the first voltage level and is lower than a voltage level of the supply voltage line, and wherein the level shifter is configured to decrease the voltage level of the output node from a third voltage level to a fourth voltage level, when an inverted clock signal that has a phase opposite to a phase of the clock signal and has the second voltage level is received.

2. The electronic device of claim 1, wherein the level shifter is configured to regulate the voltage level of the output node to the third voltage level, which is greater than the second voltage level, when the clock signal having the second voltage level is received.

3. The electronic device of claim 1, wherein the level shifter is configured to output the third current, when the clock signal having the second voltage level is received and the voltage level of the first node is a voltage level of the ground voltage line.

4. The electronic device of claim 1, wherein the level shifter is configured to regulate the voltage level of the output node based on the clock signal and the inverted clock signal, and the level shifter is configured to block an output of the third current to the output node based on the voltage level of the first node and output a fourth current from the output node to the ground voltage line regardless of the voltage level of the first node, when the inverted clock signal having the second voltage level is received.

5. The electronic device of claim 4, wherein the level shifter is configured to output the first current from the supply voltage line to the first node regardless of the voltage level of the output node and block an output of the second current from the first node to the ground voltage line, when the clock signal having the first voltage level is received.

6. The electronic device of claim 1, wherein the level shifter includes:

a first transistor configured to determine whether to output the first current, based on the clock signal;

a second transistor configured to determine whether to output the second current, based on the clock signal; and the first transistor is between the supply voltage line and the second transistor.

7. The electronic device of claim 6, wherein the first transistor is a PMOS transistor, and the second transistor is an NMOS transistor.

8. An electronic device comprising:

a level shifting circuit configured to determine whether to output a first current from a supply voltage line to an output node based on a voltage level of a first node, and determine whether to output a second current from the supply voltage line to a third node based on a voltage level of a second node;

a first adjusting circuit configured to block an output of a third current from the third node to the first node, when a clock signal having a first voltage level is received; and a second adjusting circuit configured to output a fourth current from the first node to a ground voltage line, when the clock signal having the first voltage level is received, wherein the clock signal is a signal swinging between the first voltage level and a second voltage level lower than the first voltage level, wherein the first voltage level is lower than a voltage level of the supply voltage line, wherein the first adjusting circuit is configured to output the first current to the second node, regardless of a voltage level of the clock signal, when the first current is received from the level shifting circuit, and wherein the second adjusting circuit is configured to block an output of the first current from the first adjusting circuit to the ground voltage line, when an inverted clock signal, which is opposite in phase to the clock signal, having the second voltage level is received.

9. The electronic device of claim 8, wherein the level shifting circuit is configured to output the first current to regulate a voltage level of the output node to a voltage level higher than the first voltage level.

10. The electronic device of claim 8, wherein the level shifting circuit includes:

a first transistor configured to determine whether to output the first current, based on the voltage level of the first node; and a second transistor configured to determine whether to output the second current, based on the voltage level of the second node.

11. The electronic device of claim 10, wherein the first transistor and the second transistor are PMOS transistors.

12. The electronic device of claim 8, wherein the first adjusting circuit includes:

a first transistor configured to block the output of the third current to the first node, when the clock signal having the first voltage level is received; and a second transistor configured to output the first current from the level shifting circuit to the second node, regardless of the voltage level of the clock signal.

13. The electronic device of claim 12, wherein the first transistor is a PMOS transistor, and the second transistor is an NMOS transistor.

14. The electronic device of claim 8, wherein the second adjusting circuit includes:

a first transistor configured to output the fourth current to the ground voltage line, when the clock signal having the first voltage level is received; and a second transistor configured to block an output of a fifth current from the second node to the ground voltage line, when an inverted clock signal having the second voltage level is received.

15. The electronic device of claim 14, wherein the first transistor and the second transistor are NMOS transistors.

16. The electronic device of claim 8, wherein the level shifting circuit includes a PMOS transistor between the supply voltage line and the output node and a PMOS transistor between the supply voltage line and the third node, the first adjusting circuit includes an NMOS transistor between the output node and the second node and a PMOS transistor between the third node and the first node, and the second adjusting circuit includes an NMOS transistor between the second node and the ground voltage line and an NMOS transistor between the first node and the ground voltage line.

17. An electronic device comprising:

a first PMOS transistor configured to determine whether to connect a supply voltage line with a second node, based on a voltage level of a first node;

a second PMOS transistor configured to determine whether to connect the second node with a third node, based on a clock signal swinging between a first voltage level and a second voltage level;
a first NMOS transistor configured to determine whether to connect the third node with a ground voltage line, based on the clock signal;
a third PMOS transistor configured to determine whether to connect the supply voltage line with an output node, based on a voltage level of the third node;
a second NMOS transistor configured to determine whether to connect the first node with the ground voltage line, based on an inverted clock signal, a phase of the inverted clock signal corresponding to an inverted version of a phase of the clock signal; and
a third NMOS transistor configured to determine whether to connect the output node with the first node, based on the voltage level of the supply voltage line,
wherein the first voltage level is higher than the second voltage level and is lower than a voltage level of the supply voltage line.

* * * * *